(12) United States Patent
Tateyama et al.

(10) Patent No.: US 12,071,182 B2
(45) Date of Patent: Aug. 27, 2024

(54) ELECTRICAL DRIVE DEVICE AND ELECTRICAL POWER STEERING DEVICE

(71) Applicant: HITACHI AUTOMOTIVE SYSTEMS, LTD., Hitachinaka (JP)

(72) Inventors: Tetsuro Tateyama, Hitachinaka (JP); Hideyuki Hara, Hitachinaka (JP); Akira Ishii, Hitachinaka (JP)

(73) Assignee: HITACHI ASTEMO, LTD., Hitachinaka (JP)

(*) Notice: Subject to any disclaimer, the term of this patent is extended or adjusted under 35 U.S.C. 154(b) by 1049 days.

(21) Appl. No.: 16/968,641

(22) PCT Filed: Sep. 7, 2018

(86) PCT No.: PCT/JP2018/033148
§ 371 (c)(1),
(2) Date: Aug. 10, 2020

(87) PCT Pub. No.: WO2019/159407
PCT Pub. Date: Aug. 22, 2019

(65) Prior Publication Data
US 2020/0406959 A1    Dec. 31, 2020

(30) Foreign Application Priority Data

Feb. 14, 2018  (JP) .................... 2018-023753

(51) Int. Cl.
*B62D 5/04* (2006.01)
*H02K 5/22* (2006.01)
*H02K 11/33* (2016.01)

(52) U.S. Cl.
CPC ......... *B62D 5/0409* (2013.01); *B62D 5/0406* (2013.01); *B62D 5/0463* (2013.01);
(Continued)

(58) Field of Classification Search
CPC .... H02K 2211/03; H02K 5/225; H02K 11/33; B62D 5/0463; B62D 5/0406; B62D 5/0409
See application file for complete search history.

(56) References Cited

U.S. PATENT DOCUMENTS 5,695,348 A   12/1997  Legrady
2010/0208425 A1*  8/2010  Rapisarda ............ A41D 27/085
                                                    361/692
(Continued)

FOREIGN PATENT DOCUMENTS

JP   H02-111065 U   9/1990
JP   H02-111074 U   9/1990
(Continued)

OTHER PUBLICATIONS

International Search Report issued in corresponding application No. PCT/JP2018/033148 dated Oct. 16, 2018 with English translation.
(Continued)

*Primary Examiner* — Forrest M Phillips
(74) *Attorney, Agent, or Firm* — FOLEY & LARDNER LLP

(57) ABSTRACT

A connector terminal (40) is formed by a connector joining portion (400) that is joined to a mating connector terminal, a connector bonding portion (40A) that is bent from the connector joining portion (40C) and extends along a surface of a board (31) and a movement stopper portion (40P-C) that engages with a movement stopper part (31E) provided at the board (31) and stops the connector bonding portion (40A) from moving on the surface of the board (31). In a state in which the connector bonding portion (40A) is put on solder applied to the board (31), the movement stopper portion (40P-C) engages with the movement stopper part (31E) of
(Continued)

the board (31), and the connector terminal (40) is bonded and fixed to the board (31) with melted solder.

12 Claims, 12 Drawing Sheets

(52) U.S. Cl.
CPC .............. *H02K 5/225* (2013.01); *H02K 11/33* (2016.01); *H02K 2211/03* (2013.01)

(56) References Cited

U.S. PATENT DOCUMENTS

| 2015/0180316 | A1 | 6/2015 | Maeshima | |
| 2018/0229763 | A1* | 8/2018 | Kim | B62D 5/0409 |
| 2018/0233992 | A1* | 8/2018 | Takeuchi | H02K 11/02 |
| 2019/0273416 | A1* | 9/2019 | Kizu | H02K 5/04 |
| 2019/0310150 | A1* | 10/2019 | Horiba | G01L 5/0085 |
| 2019/0351935 | A1* | 11/2019 | Kim | B62D 5/0406 |

FOREIGN PATENT DOCUMENTS

| JP | H09-017475 | A | | 1/1997 |
| JP | 2005-222861 | A | | 8/2005 |
| JP | 2015-134598 | A | | 7/2015 |
| JP | 2015-202011 | A | | 11/2015 |
| JP | 2017-055567 | A | | 3/2017 |
| JP | 2019176727 | A | * | 10/2019 |

OTHER PUBLICATIONS

Written Opinion issued in corresponding application No. PCT/JP2018/033148 dated Oct. 16, 2018 with English translation.

* cited by examiner

ELECTRICAL DRIVE DEVICE AND ELECTRICAL POWER STEERING DEVICE

TECHNICAL FIELD

The present invention relates to an electrical drive device (an electric drive device) and an electrical power steering device (an electric power steering device), and more particularly to an electric drive device and an electric power steering device in which an electronic control device (an electronic control unit) is mounted.

BACKGROUND ART

In a field of general industrial equipment, a mechanical control element is driven by an electric motor. In recent years, so-called electrically mechanically integrated electric drive device, which is configured such that an electronic control unit formed from a semiconductor element etc. controlling a rotation speed and/or a rotation torque of the electric motor is integrally mounted in the electric motor, has been used.

As an example of the electrically mechanically integrated electric drive device, for instance, an electric power steering device is configured such that a turning direction and a turning torque of a steering shaft that turns by driver's operation of a steering wheel are detected, and on the basis of these detection values, the electric motor is driven so as to rotate in the same direction as the turning direction of the steering shaft, then a steering assist torque is generated. To control this electric motor, the power steering device is provided with an electronic control unit (ECU).

As a related art electric power steering device, for instance, an electric power steering device disclosed in Japanese Unexamined Patent Application Publication No. 2015-134598 (Patent Document 1) is known. Patent Document 1 discloses the electric power steering device configured by an electric motor and an electronic control unit. The electric motor is housed in a motor housing having a cylindrical portion made of aluminum alloy etc. . . . The electronic control unit is housed in an ECU housing located at an opposite side to an output shaft of the electric motor in an axial direction of the motor housing. The electronic control unit housed in the ECU housing has a power supply circuit unit, a power conversion circuit unit having a power switching element such as a MOSFET that drives and controls the electric motor and a control circuit unit that controls the power switching element. An output terminal of the power switching element and an input terminal of the electric motor are electrically connected through a bus bar.

The electronic control unit housed in the ECU housing is supplied with power from a power supply through a resin-made connector assembly made of synthetic resin. Further, detection signals concerning an operating state etc. are sent to the electronic control unit from detection sensors. The resin-made connector assembly functions as a lid member or a cover member. The resin-made connector assembly is connected to the electronic control unit so as to close an opening of the ECU housing, and fixed to an outer peripheral surface of the ECU housing with fixing bolts.

As other electric drive devices in which the electronic control device (the electronic control unit) is integrally mounted, an electric brake and an electric hydraulic pressure controller for various kinds of hydraulic pressure controls are known.

CITATION LIST

Patent Document

Patent Document 1: Japanese Unexamined Patent Application Publication No. 2015-134598

SUMMARY OF THE INVENTION

Technical Problem

Here, in the electric drive device that is an object of the present invention, as shown in FIGS. 17 and 19, a connecting part through which power is supplied from a resin-made connector assembly 60 connected to the power supply to a power supply circuit unit 61 is configured such that an assembly-side connector terminal 62 extending from the resin-made connector assembly 60 overlaps a power supply-side connector terminal 63 provided at the power supply circuit unit 61, and top ends 62*t* and 63*t* of these overlapping portions are joined together by TIG welding. These assembly-side connector terminal 62 and power supply-side connector terminal 63 are formed by bending a thin narrow metal plate.

The assembly-side connector terminal 62 and the power supply-side connector terminal 63 overlap each other and are joined together. Therefore, a soldering bonding surface, which is bonded to a board 64 of the power supply circuit unit 61, of the power supply-side connector terminal 63 has to have a shape that extends to the assembly-side connector terminal 62 side, then the power supply-side connector terminal 63 has a substantially L-shaped connector terminal shape.

This power supply-side connector terminal 63 is put on the board 64, and connected (fixed) to the board 64 by soldering. The soldering of the power supply-side connector terminal 63 is generally performed by a reflow process. The reflow process is a soldering manner by which paste-like solder called solder paste is previously applied on a wiring pattern of the board 64, the soldering bonding surface of the power supply-side connector terminal 63 is put on the board 64, and by providing heat to the board 64, the solder melts.

In a case where the substantially L-shaped power supply-side connector terminal 63 is used, as shown in FIG. 18, since the solder existing at an inward side on a surface of the board 64 is larger in quantity, in a state in which the solder melts by the reflow process, a phenomenon in which the power supply-side connector terminal 63 moves inwards, as shown by an arrow, on the board 64 by surface tension etc. of the melted solder occurs.

For this reason, after the reflow process, as shown in FIG. 19, in a process in which the assembly-side connector terminal 62 and the power supply-side connector terminal 63 overlap each other and the top ends 62*t* and 63*t* of the overlapping portions are flush with each other and joined together by TIC welding, if the power supply-side connector terminal 63 moves inwards on the board 64, the assembly-side connector terminal 62 and the power supply-side connector terminal 63 interfere with each other, and as a consequence, there arises a problem of not properly joining the top ends 62*t* and 63*t* together by TIG welding.

Further, as another problem, a bending external force acts on the power supply-side connector terminal 63 from the assembly-side connector terminal 62 in the TIG welding process, and a stress by which the power supply-side connector terminal 63 comes off the solder occurs.

Here, these problems do not occur only between the assembly-side connector terminal 62 and the power supply-side connector terminal 63, but also occur between connector terminals of the power supply circuit unit and an inverter circuit unit since the connector terminals of the power supply circuit unit and the inverter circuit unit have the same structure.

An object of the present invention is therefore to provide a new electric drive device and a new electric power steering device that are capable of soldering the connector terminal to a correct position on the board without movement of the connector terminal when soldering the connector terminal to the board by the reflow process.

Solution to Problem

In present invention, a connector terminal is formed by a connector joining portion that is joined to a mating connector terminal, a connector bonding portion that is bent from the connector joining portion and extends along a surface of a board and a movement stopper portion that engages with a movement stopper part provided at the board and stops the connector bonding portion from moving on the surface of the board. In a state in which the connector bonding portion is put on solder applied to the board, the movement stopper portion engages with the movement stopper part of the board, and the connector terminal is bonded and fixed to the board with melted solder.

Effects of Invention

According to the present invention, when soldering the connector terminal to the board by the ref low process, the movement stopper portion engages with the movement stopper part of the board. Therefore, in a state in which the solder melts by the reflow process, the connector terminal does not move on the board by surface tension etc. of the melted solder, and the connector terminal can be soldered to a correct position on the board.

EMBODIMENTS FOR CARRYING OUT THE INVENTION

An embodiment of the present invention will be explained in detail below with reference to the drawings. The present invention is not limited to the following embodiment, and includes all design modifications and equivalents belonging to the technical scope of the present invention.

Figure 1:
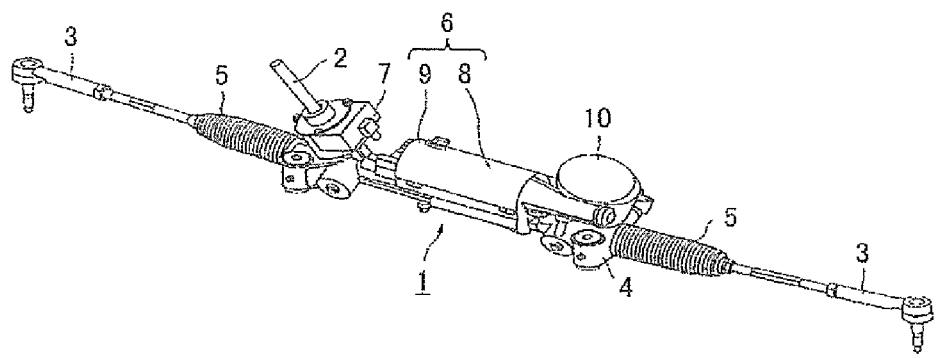
FIG. 1 is a general perspective view of a steering device as an example to which the present invention is applied.

Before explaining the embodiment of the present invention, a configuration of a steering device as an example to which the present invention is applied will be briefly explained using FIG. 1.

First, a steering device to steer front wheels of a vehicle will be explained. A steering device 1 is configured as shown in FIG. 1. A pinion (not shown) is provided at a lower end of a steering shaft 2 connecting to a steering wheel (not shown). This pinion is engaged with a rack (not shown) that extends in right and left directions of a vehicle body. A tie rod 3 to steer the front wheels in the right and left directions is each connected to both ends of the rack. The rack is accommodated in a rack housing 4. Between the rack housing 4 and each tie rod 3, a rubber boot 5 is provided.

The steering device 1 is provided with an electric power steering device 6 to assist torque when performing a turning operation of the steering wheel. That is, a torque sensor 7 that detects a turning direction and a turning torque of the steering shaft 2 is provided. And, an electric motor unit 8 that provides a steering assistive force to the rack via a gear 10 on the basis of a detection value of the torque sensor 7 is provided. Further, an electronic control unit (ECU) 9 that controls an electric motor disposed in the electric motor unit 8 is provided. The electric motor unit 8 of the electric power steering device 6 is connected to the gear 10 at three portions of an outer periphery at an output shaft side of the electric motor unit 8 with screws (not shown). The electronic control unit 9 is disposed on an opposite side to the output shaft side of the electric motor unit 8.

In the electric power steering device 6, when the steering shaft 2 is turned in any turning direction by the steering wheel operation, the torque sensor 7 detects the turning direction and the turning torque of the steering shaft 2. A control circuit unit calculates a drive operation amount of the electric motor on the basis of these detection values. The electric motor is then driven by a power switching element of a power conversion circuit unit on the basis of the calculated drive operation amount. And, an output shaft of the electric motor rotates so as to drive and rotate the steering shaft 2 in the same direction as a direction of the steering wheel operation. This rotation of the output shaft of the electric motor is transmitted to the rack (not shown) through the pinion (not shown) and the gear 10, and the vehicle is steered. Since such configuration and workings are well known, a further explanation will be omitted here.

Figure 18:
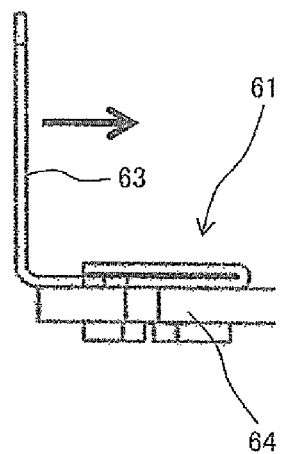
FIG. 18 is a cross section for explaining a connecting state between the power supply-side connector terminal and a board, according to the related art.

As mentioned above, as shown in FIG. 18, since the solder existing at the inward side on the surface of the board 64 is larger in quantity, in the state in which the solder melts by the reflow process, the phenomenon in which the power supply-side connector terminal 63 moves inwards, as shown by the arrow, on the board 64 by surface tension etc. of the melted solder occurs.

Figure 19:
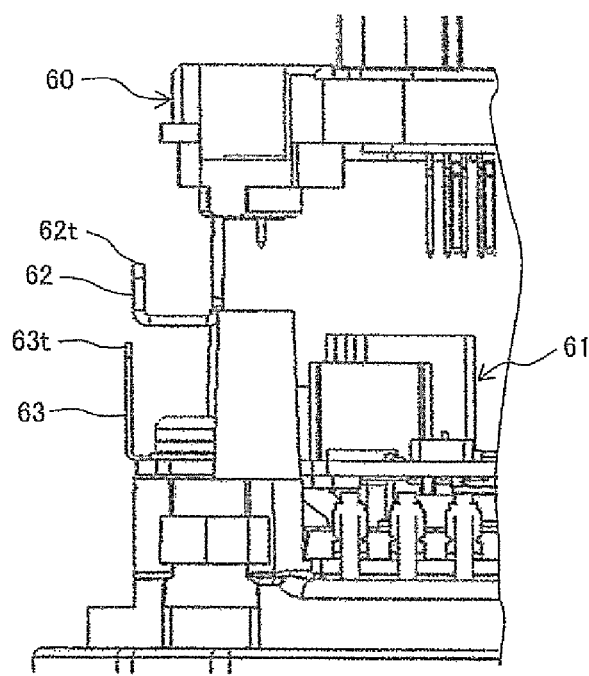
FIG. 19 is an explanatory drawing for explaining a state in which an assembly-side connector terminal of a connector assembly and the power supply-side connector terminal are welded by TIG welding.

Therefore, after the reflow process, as shown in FIG. 19, in the process in which the assembly-side connector terminal 62 and the power supply-side connector terminal 63 overlap each other and the top ends 62*t* and 63*t* of the overlapping portions are joined together by TIG welding, if the power supply-side connector terminal 63 moves inwards on the board 64, the assembly-side connector terminal 62 and the power supply-side connector terminal 63 interfere with each other, and as a consequence, the problem of not properly joining the top ends 62*t* and 63*t* together by TIG welding occurs. Further, as another problem, the bending external force acts on the power supply-side connector terminal 63 from the assembly-side connector terminal 62 in the TIG welding process, and the stress by which the power supply-side connector terminal 63 comes off the solder occurs.

From such background, the present invention proposes an electric drive device and an electric power steering device having the following configuration.

In the present embodiment, a connector terminal is formed by a connector joining portion that is joined to a mating connector terminal, a connector bonding portion that is bent from the connector joining portion and extends along a surface of a board and a movement stopper portion that engages with a movement stopper part provided at the board and stops the connector bonding portion from moving on the surface of the board. In a state in which the connector bonding portion is put on solder applied to the board, the movement stopper portion engages with the movement stopper part of the board, and the connector terminal is bonded and fixed to the board with melted solder.

According to the above configuration, when soldering the connector terminal to the board by the reflow process, the movement stopper portion engages with an engagement surface of the movement stopper part of the board. Therefore, in a state in which the solder melts by the reflow process, the connector terminal does not move on the board by surface tension etc. of the melted solder, and the connector terminal can be soldered to a correct position on the board.

In the following description, configurations of the electric drive device and the electric power steering device according to the embodiment of the present invention will be explained in detail with reference to FIGS. 2 to 13.

Figure 2:
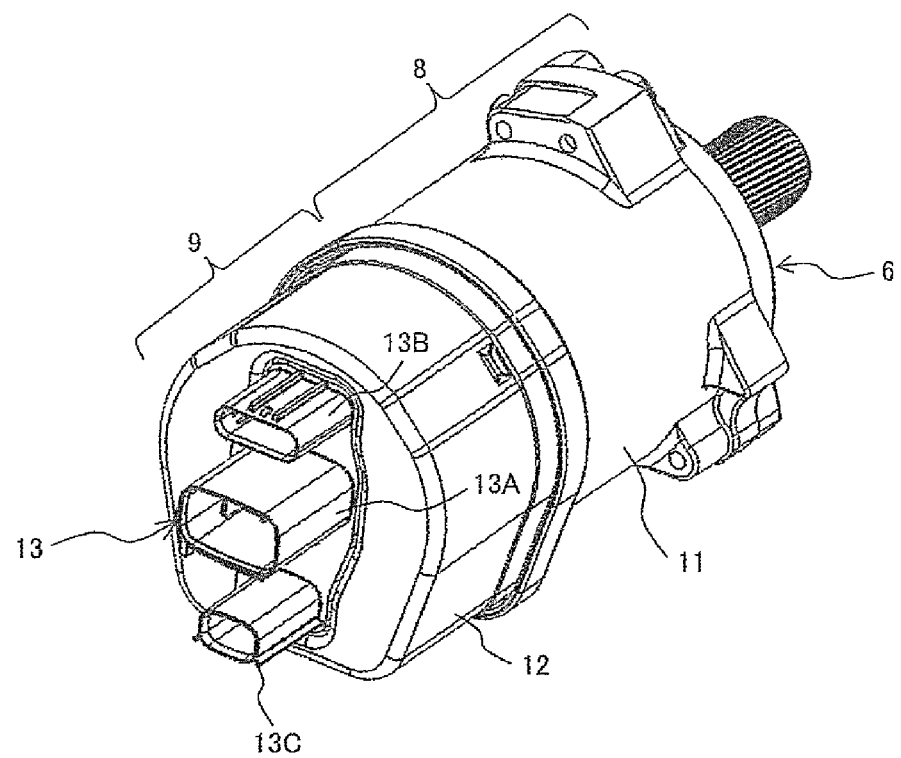
FIG. 2 is a perspective view showing an entire shape of an electric power steering device according to an embodiment of the present invention.
Figure 3:
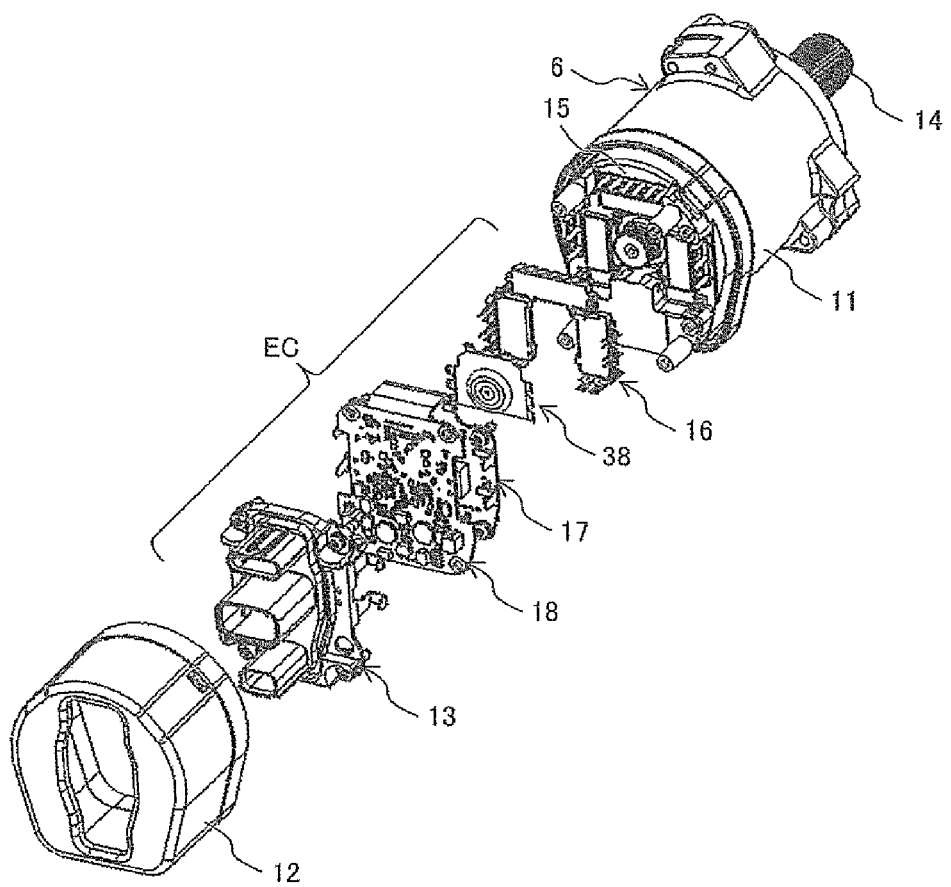
FIG. 3 is a perspective exploded view of the electric power steering device shown in FIG. 2.

FIG. 2 is a drawing showing a general configuration of the electric power steering device according to the present embodiment. FIG. 3 is a drawing, viewed from an oblique direction, with components of the electric power steering device shown in FIG. 2 dismantled. FIGS. 4 to 9 are drawings showing assembly states of components that are assembled in an assembly order. The embodiment will be explained below with reference to the drawings.

As shown in FIG. 2, an electric motor unit 8 forming the electric power steering device is configured by a motor housing 11 having a cylindrical portion made of aluminum or aluminum-based metal such as aluminum alloy and an electric motor (not shown) accommodated in the motor housing 11. An electronic control unit 9 is configured by a metal cover 12 made of aluminum, aluminum-based metal such as aluminum alloy or iron-based metal and located at an opposite side to an output shaft of the electric motor in an axial direction of the motor housing 11 and an electronic control assembly (not shown) accommodated in this metal cover 12.

The motor housing 11 and the metal cover 12 are fixedly connected to each other at a fixing region that is formed at their opposing end surfaces in an outer circumferential direction by caulking or swaging fixation. The electronic control assembly accommodated inside the metal cover 12 is configured by a power supply circuit unit that generates a required power, a power conversion circuit unit having a power switching element such as a MOSFET and an IGBT that drive and control the electric motor of the electric motor unit 8, and a control circuit unit that controls the power switching element. An output terminal of the power switching element and an input terminal of a coil of the electric motor are electrically connected through a bus bar.

A resin-made connector assembly 13 is exposed from an opening formed at an end surface, which is located at an opposite side to the motor housing 11, of the metal cover 12. The resin-made connector assembly 13 is fixed to fixing portions formed at the motor housing 11 with fixing screws. The resin-made connector assembly 13 has a connector terminal forming portion 13A for power supply, a connector terminal forming portion 13B for detection sensors, and a connector terminal forming portion 13C for control state output by which a control state is outputted to an external device.

The electronic control assembly accommodated in the metal cover 12 is supplied with power from a power supply through the synthetic-resin-made connector terminal forming portion 13A for power supply. Further, the electronic control assembly is provided with detection signals of an operating condition etc. from the detection sensors through the connector terminal forming portion 13B for detection sensors. A current control state signal of the electric power steering device is outputted from the electronic control assembly through the connector terminal forming portion 13C for control state output.

FIG. 3 is a perspective exploded view of the electric power steering device 6. An iron-made annular side yoke (not shown) is fitted to an inside of a motor housing 11. The electric motor is accommodated inside this side yoke. An output shaft portion 14 of the electric motor provides the steering assistive force to the rack via the gear. Since a specific structure of the electric motor is well known, its explanation will be omitted here.

The motor housing 11 is made of aluminum alloy, and acts as a heat sink that radiates or releases heat generated at the electric motor and heat generated in after-mentioned power supply circuit unit and power conversion circuit unit to the outside atmosphere. The electric motor and the motor housing 11 form the electric motor unit 8.

An electronic control unit EC is connected to an end surface portion 15 of the motor housing 11 which is an opposite side to the output shaft portion 14 of the electric motor unit 8. The electronic control unit EC has the power conversion circuit unit 16, the power supply circuit unit 17, the control circuit unit 18 and the resin-made connector assembly 13. The end surface portion 15 of the motor housing 11 is formed integrally with the motor housing 11. However, the end surface portion 15 could be formed separately from the motor housing 11, then fixed to the motor housing 11 with screws or by welding.

Here, the power conversion circuit unit 16, the power supply circuit unit 17 and the control circuit unit 18 form a redundant system (a dual-redundancy system) by a main electronic control unit and a sub-electronic control unit. In a normal condition, the electric motor is driven and controlled by the main electronic control unit. However, if an abnormal condition or a failure occurs at the main electronic control unit, the control is switched to the sub-electronic control unit, and the electric motor is driven and controlled by the sub-electronic control unit.

Therefore, normally, heat from the main electronic control unit is transmitted to the motor housing 11. If the abnormal condition or the failure occurs at the main electronic control unit, the main electronic control unit stops and the sub-electronic control unit operates, then heat from the sub-electronic control unit is transmitted to the motor housing 11. This will be described later.

However, both of the main electronic control unit and the sub-electronic control unit could operate as a regular electronic control unit. And, if the abnormal condition or the failure occurs at one of the electronic control units, the other electronic control unit drives and controls the electric motor by half ability. In this case, although capability of the electric motor is half, so-called power steering function is secured. Therefore, in the normal condition, heat from the main electronic control unit and the sub-electronic control unit is transmitted to the motor housing 11.

The electronic control unit EC is configured by the power conversion circuit unit 16, the power supply circuit unit 17, the control circuit unit 18 and the resin-made connector assembly 13. These power conversion circuit unit 16, power supply circuit unit 17, control circuit unit 18 and resin-made connector assembly 13 are arranged in this order from the end surface portion 15 side to a direct ion moving away from the end surface portion 15. The control circuit unit 18 is a unit that generates a control signal for driving the switching element of the power conversion circuit unit 16, and is configured by a microcomputer and a peripheral circuit and so on. The power supply circuit unit 17 is a unit that generates power to drive the control circuit unit 18 and power for the power conversion circuit unit 16, and is configured by a capacitor, a coil and a switching element and so on. The power conversion circuit unit 16 is a unit that controls power (current) flowing in the coil of the electric motor, and is configured by a switching element that forms three-phase upper and lower arms and so on.

A unit having a large heat value in the electronic control unit EC is mainly the power conversion circuit unit 16 and the power supply circuit unit 17. Heat of the power conversion circuit unit 16 and the power supply circuit unit 17 is released from the motor housing 11 made of aluminum alloy. This detailed structure or configuration will be described with reference to FIGS. 4 to 9 later.

The resin-made connector assembly 13 made of synthetic resin is arranged between the control circuit unit 18 and the metal cover 12, and is connected to a vehicle battery (the power supply) and other external control device (not shown). Needless to say, the resin-made connector assembly 13 is connected to the power conversion circuit unit 16, the power supply circuit unit 17 and the control circuit unit 18.

The metal cover 12 has a function of accommodating and liquid-tightly sealing the power conversion circuit unit 16, the power supply circuit unit 17 and the control circuit unit 18. In the present embodiment, the metal cover 12 is fixed to the motor housing 11 by the caulking or swaging fixation.

Figure 4:
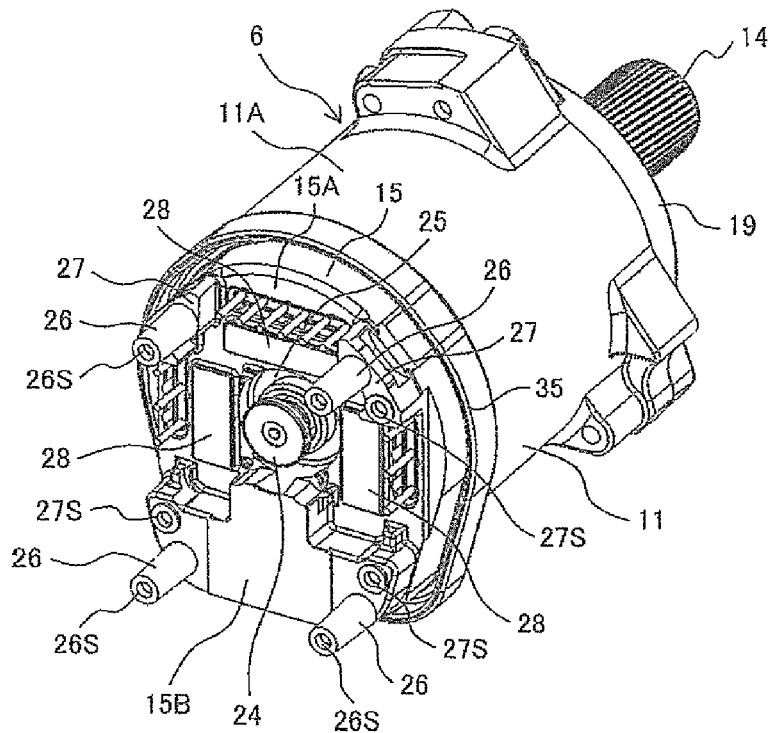
FIG. 4 is a perspective view of a motor housing shown in FIG. 3.
Figure 5:
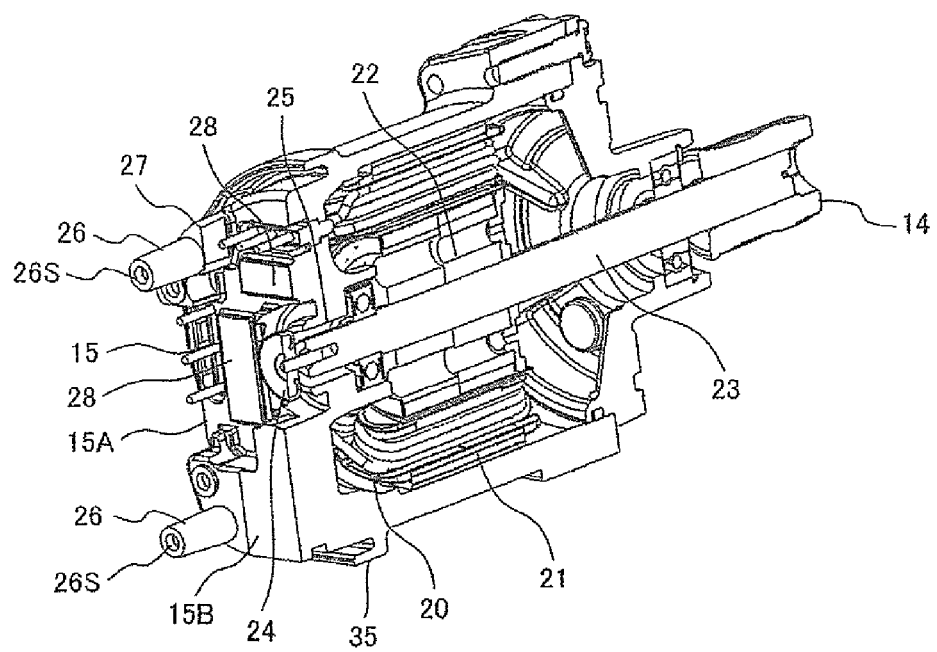
FIG. 5 is a cross section of the motor housing shown in FIG. 4, which is cut in an axial direction of the motor housing.

Next, structure or configuration of each component and an assembling method of the components will be explained with reference to FIGS. 4 to 9. FIG. 4 is an external view of the motor housing 11. FIG. 5 is a cross section of the motor housing 11, which is cut in an axial direction of the motor housing 11.

In FIGS. 4 and 5, the motor housing 11 is shaped into a cylindrical or tubular shape. The motor housing 11 has a side peripheral surface portion 11A, the end surface portion 15 that closes one end of the side peripheral surface portion 11A and an end surface portion 19 that closes the other end of the side peripheral surface portion 11A. In the present embodiment, the side peripheral surface portion 11A and the end surface portion 15 are formed integrally with each other, then the motor housing 11 has a bottomed cylindrical shape. The end surface portion 19 serves as a lid, and closes the other end of the side peripheral surface portion 11A after accommodating the electric motor in the side peripheral surface portion 11A.

Figure 9:
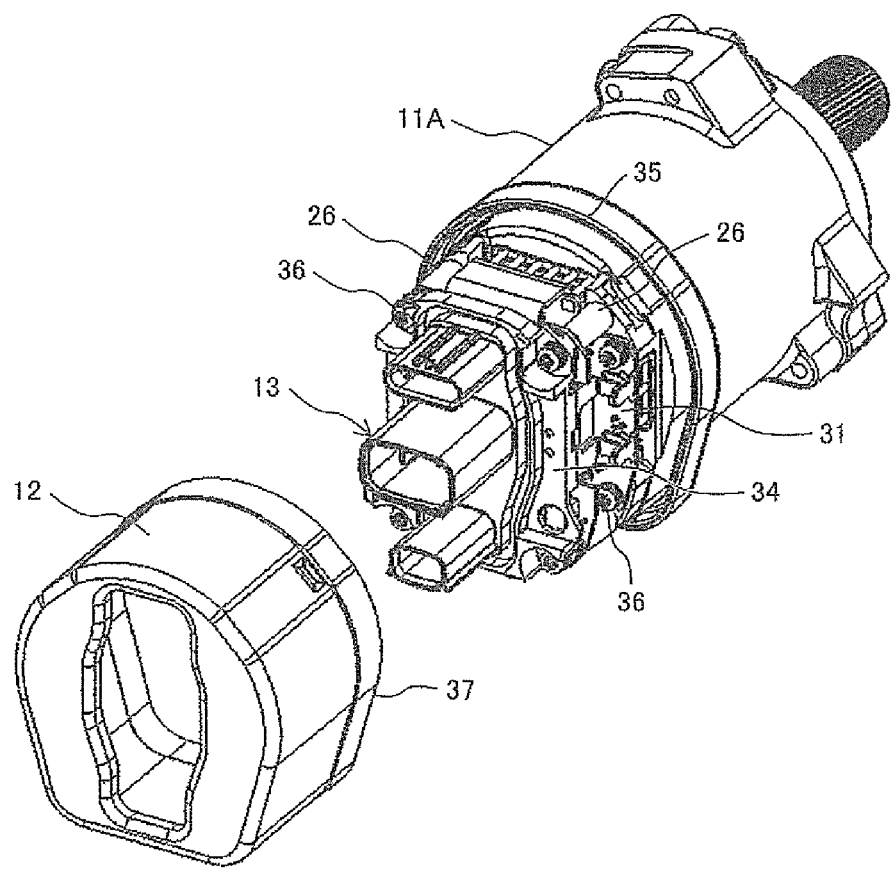
FIG. 9 is a perspective view of the motor housing shown in FIG. 8 with a resin-made connector assembly further mounted on and fixed to the motor housing.

An annular groove portion (hereinafter called a motor housing side annular groove portion) 35 whose diameter is enlarged outwards in a radial direction is formed at an entire circumferential surface of the end surface portion 15. Then, an opening end (hereinafter called a metal cover side annular top end portion) 37 of the metal cover 12 shown in FIG. 9 is engaged with this motor housing side annular groove portion 35. The motor housing side annular groove portion 35 and the metal cover side annular top end portion 37 (see FIG. 9) of the metal cover 12 are liquid-tightly connected together with so-called liquid sealant.

As shown in FIG. 5, a stator 21 having cores around which coils 20 are wound is fitted in the side peripheral surface portion 11A of the motor housing 11, and a rotor 22 in which a permanent magnet is embedded is rotatably accommodated inside this stator 21. A rotation shaft 23 is fixed to the rotor 22, and its one end is the output shaft portion 14, and its other end is a rotation detection portion 24 for detecting a rotation phase and a rotation speed of the rotation shaft 23. The rotation detection portion 24 is provided with a permanent magnet, and protrudes to the outside through a penetration hole 25 formed at the end surface portion 15. The rotation phase and the rotation speed of the rotation shaft 23 are detected by a magnetism detecting portion configured by a GMR element (not shown) etc. . . .

Returning to FIG. 4, heat radiating sections (heat releasing sections) 15A and 15B for the power conversion circuit unit 16 (see FIG. 3) and the power supply circuit unit 17 (see FIG. 3) are formed on a surface of the end surface portion 15 located at an opposite side to the output shaft portion 14 of the rotation shaft 23. Further, board-connector fixing protrusions 26 are formed integrally with the end surface portion 15 at four corners of the end surface portion 15 so as to stand on or protrude from the surface of the end surface portion 15. Each board-connector fixing protrusion 26 has a screw hole 26S inside the board-connector fixing protrusion 26.

The board-connector fixing protrusion 26 is provided to secure an after-mentioned circuit board of the control circuit unit 18 and also the resin-made connector assembly 13. The board-connector fixing protrusions 26 protruding from the power-conversion-circuit heat releasing section 15A (described later) each have a board receiving portion 27 whose height in the axial direction is the same as that of the power-supply-circuit heat releasing section 15B (described later). Each board receiving portion 27 has a screw hole 27S. This board receiving portion 27 is a portion which an after-mentioned glass epoxy circuit board 31 of the power supply circuit unit 17 is mounted on and fixed to.

A plane area in the radial direction orthogonal to the rotation shaft 23, which forms the end surface portion 15, is sectioned off into two sections. One is the power-conversion-circuit heat releasing section 15A to which the power conversion circuit unit 16 having the power switching element such as the MOSFET is fixed, and the other is the power-supply-circuit heat releasing section 15B to which the power supply circuit unit 17 is fixed. In the present embodiment, an area of the power-conversion-circuit heat releasing section 15A is greater than that of the power-supply-circuit heat releasing section 15B. This is because that the redundant system is employed as described above and a mounting area of the power conversion circuit unit 16 is secured.

And, a different height step in the axial direction (a direction in which the rotation shaft 23 extends) is provided between the power-conversion-circuit heat releasing section 1514 and the power-supply-circuit heat releasing sect ion 15B. That is, the power-supply-circuit heat releasing section 15B is formed so as to have a step that is away from the power-conversion-circuit heat releasing section 15A in the direction of the rotation shaft 23 of the electric motor. This step is set to such a height that the power conversion circuit unit 16 and the power supply circuit unit 17 do not interfere with each other when the power supply circuit unit 17 is mounted after the power conversion circuit unit 16 is mounted.

The power-conversion-circuit heat releasing section 15A is provided with three long narrow rectangular protruding heat releasing portions 28. These protruding heat releasing portions 28 are portions on which the power conversion circuit unit 16 for the redundant system is mounted. The protruding heat releasing portions 28 protrude from the surface of the power-conversion-circuit heat releasing section 15A in the direction of the rotation shaft 23 of the electric motor so as to be away from the electric motor.

The power-supply-circuit heat releasing section 15B is formed into a flat surface, and the power supply circuit unit 17 is mounted on the power-supply-circuit heat releasing section 15B. Therefore, the protruding heat releasing portion 28 acts as a heat releasing portion that releases and transmits heat generated at the power conversion circuit unit 16 to the end surface portion 15, and the power-supply-circuit heat releasing section 15B acts as a heat releasing portion that releases and transmits heat generated at the power supply circuit unit 17 to the end surface portion 15.

The protruding heat releasing portions 28 might be removed. In this case, the power-conversion-circuit heat releasing section 15A acts as the heat releasing portion that releases and transmits heat generated at the power conversion circuit unit 16 to the end surface portion 15. In the present embodiment, a metal board of the power conversion circuit unit 16 is welded to the protruding heat releasing portions 28 by frictional stir welding, which securely fixes the metal board to the protruding heat releasing portions 28.

As described above, in the present embodiment, a heat sink member is not needed at the end surface portion 15 of the motor housing 11, then a length in the axial direction can be shortened. Further, since the motor housing 11 has a sufficient heat capacity, it is possible to efficiently radiate or release heat of the power supply circuit unit 17 and the power conversion circuit unit 16 to the outside from the motor housing 11.

Figure 6:
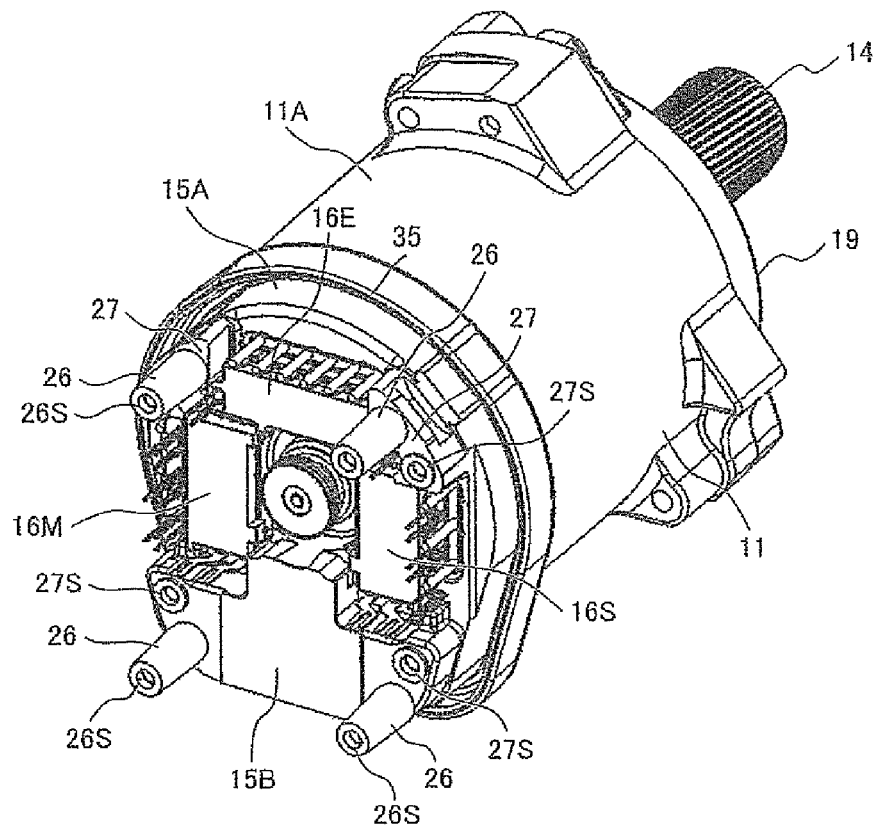
FIG. 6 is a perspective view of the motor housing shown in FIG. 4 with a power conversion circuit unit mounted on and fixed to the motor housing.

Next, FIG. 6 shows a state in which the power conversion circuit unit 16 is mounted on the protruding heat releasing portions 28 (see FIG. 4). As shown in FIG. 6, the power conversion circuit unit 16 forming the redundant system is mounted on the protruding heat releasing portions 28 (see FIG. 4) formed on the power-conversion-circuit heat releasing section 15A. The switching element forming the power conversion circuit unit 16 is mounted on the metal board (using an aluminum-based metal), which is a good heat radiation configuration. The metal board is welded to the protruding heat releasing portions 28 by frictional stir welding.

Thus, the metal board of the power conversion circuit unit 16 is firmly fixed to the protruding heat releasing portions 28, and heat generated at the switching element can be efficiently transmitted to the protruding heat releasing portions 28. Heat transmitted to the protruding heat releasing portions 28 diffuses through the power-conversion-circuit heat releasing section 15A, and is further transmitted to the side peripheral surface portion 11A of the motor housing 11, then is released to the outside. Here, as mentioned above, since a height of the power-conversion-circuit heat releasing section 15A in the axial direction is lower than that of the power-supply-circuit heat releasing section 15B, the power conversion circuit unit 16 does not interfere with the power supply circuit unit 17.

As described above, the power conversion circuit unit 16 is mounted on the protruding heat releasing portions 28 formed on the power-conversion-circuit heat releasing section 15A. Therefore, heat generated at the switching element of the power conversion circuit unit 16 can be efficiently transmitted to the protruding heat releasing portions 28. Heat transmitted to the protruding heat releasing portions 28 diffuses through the power-conversion-circuit heat releasing section 15A, and is further transmitted to the side peripheral surface portion 11A of the motor housing 11, then is released to the outside.

Figure 7:
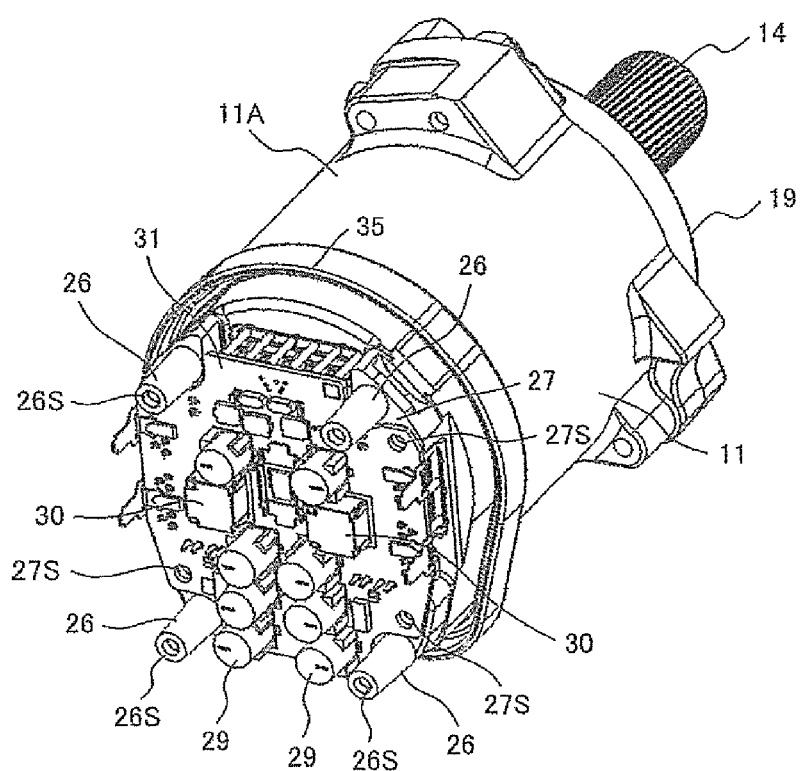
FIG. 7 is a perspective view of the motor housing shown in FIG. 6 with a power supply circuit unit further mounted on and fixed to the motor housing.

Next, FIG. 7 shows a state in which the power supply circuit unit 17 is mounted above or over the power conversion circuit unit 16. As shown in FIG. 7, the power supply circuit unit 17 is mounted on the power-supply-circuit heat releasing section 15B. Capacitors 29 and coils 30 and so on which form the power supply circuit unit 17 are mounted on the glass epoxy circuit board 31 as a power supply circuit board. The power supply circuit unit 17 has the redundant system, and as can be seen from the drawings, power supply circuits configured by the capacitors 29 and the coils 30 etc., which are arranged symmetrically with respect to each other, are provided. The glass epoxy circuit board 31 mounts thereon the electric elements such as the capacitors, except the switching element of the power conversion circuit unit 16.

A surface at the power-supply-circuit heat releasing section 15B side (see FIG. 6) of this glass epoxy circuit board 31 is fixed to the end surface portion 15 so as to contact the power-supply-circuit heat releasing section 15B. As a fixing manner, as shown in FIG. 7, the glass epoxy circuit board 31 is fixed to the screw holes 27S provided at the board receiving portions 27 of the board-connector fixing protrusions 26 with fixing screws (not shown), and also fixed to the screw holes 27S provided at the power-supply-circuit heat releasing section 15B (see FIG. 6) with fixing screws (not shown).

Here, since the power supply circuit unit 17 is formed by the glass epoxy circuit board 31, the circuit units could be mounted on both sides of the glass epoxy circuit board 31. On the surface at the power-supply-circuit heat releasing section 15B side of the glass epoxy circuit board 31, the GMR element (not shown) or a rotation phase and rotation speed detection unit that is configured by a detection circuit formed by the GMR element is mounted, and detects the rotation phase and the rotation speed of the rotation shaft 23 (see FIG. 5) in cooperation with the rotation detection portion 24 (see FIG. 5) provided at the rotation shaft 23.

As described above, since the glass epoxy circuit board 31 is fixed to the end surface portion 15 so as to contact the power-supply-circuit heat releasing section 15B, it is possible to efficiently transmit heat generated at the power supply circuit unit 17 to the power-supply-circuit heat releasing section 15B. Heat transmitted to the power-supply-circuit heat releasing section 15B is further transmitted to and diffuses through the side peripheral surface portion 11A of the motor housing 11, then is released to the outside. Here, by interposing one of a good heat transfer adhesive (or a good thermal conductive adhesive), a heat transfer grease (or a thermal conductive grease) and a heat transfer sheet (or a thermal conductive sheet) between the glass epoxy circuit board 31 and the power-supply-circuit heat releasing section 15B, a heat transfer performance (or a thermal conductivity) can be further improved.

As described above, the power supply circuit unit 17 is mounted on the power-supply-circuit heat releasing section 15B. The surface at the power-supply-circuit heat releasing section 15B side of this glass epoxy circuit board 31 on which the circuit elements of the power supply circuit unit 17 are mounted is fixed to the end surface portion 15 so as to contact the power-supply-circuit heat releasing section 15B. It is therefore possible to efficiently transmit heat generated at the power supply circuit unit 17 to the power-supply-circuit heat releasing section 15B. Heat transmitted to the power-supply-circuit heat releasing section 15B is further transmitted to and diffuses through the side peripheral surface portion 11A of the motor housing 11, then is released to the outside.

Figure 8:
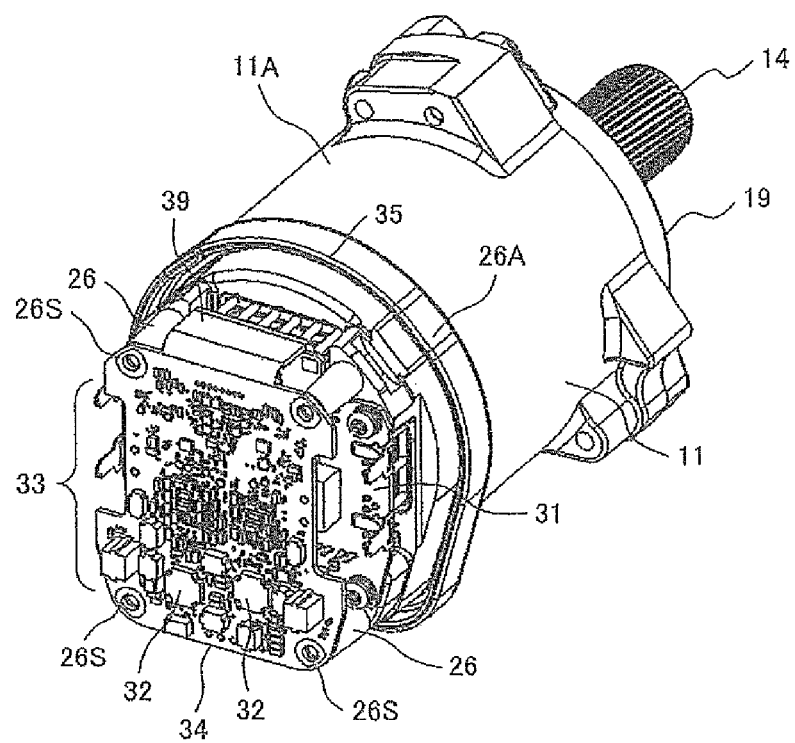
FIG. 8 is a perspective view of the motor housing shown in FIG. 7 with a control circuit unit further mounted on and fixed to the motor housing.

Next, FIG. 8 shows a state in which the control circuit unit 18 is mounted above or over the power supply circuit unit 17. As shown in FIG. 8, the control circuit unit 18 is mounted above or over the power supply circuit unit 17. Microcomputers 32 and peripheral circuits 33 which form the control circuit unit 18 are mounted on a glass epoxy circuit board 34 as a control circuit board. The control circuit unit 18 also has the redundant system, and as can be seen from the drawings, control circuits configured by the microcomputers 32 and the peripheral circuits 33, which are arranged symmetrically with respect to each other, are provided. The microcomputers 32 and the peripheral circuits 33 could be mounted on a surface at the power supply circuit unit 17 side of the glass epoxy circuit board 34.

This glass epoxy circuit board 34 is fixed to the screw holes 26S provided at tops of the board-connector fixing protrusions 26 (see FIG. 7) with fixing screws (not shown) so as to be sandwiched by the resin-made connector assembly 13, as shown in FIG. 8, then a space in which the capacitors 29 and the coils 30 etc. of the power supply circuit unit 17 shown in FIG. 7 are arranged is provided between the glass epoxy circuit board 31 of the power supply circuit unit 17 and the glass epoxy circuit board 34 of the control circuit unit 18.

Next, FIG. 9 shows a state in which the resin-made connector assembly 13 is mounted above or over the control circuit unit 18. As shown in FIG. 9, the resin-made connector assembly 13 is mounted above or over the control circuit unit 18. The resin-made connector assembly 13 is fixed to the screw holes provided at the tops of board-connector fixing protrusions 26 with fixing screws 36 so as to sandwich the control circuit unit 18 between the power supply circuit unit 17 and the resin-made connector assembly 13. In this state, as shown in FIG. 3, the resin-made connector assembly 13 is connected to the power conversion circuit unit 16, the power supply circuit unit 17 and the control circuit unit 18.

Next, a power supply-side connector terminal of the power supply circuit unit 17 according to the present embodiment will be explained in detail with reference to FIGS. 10 to 12.

Figure 10:
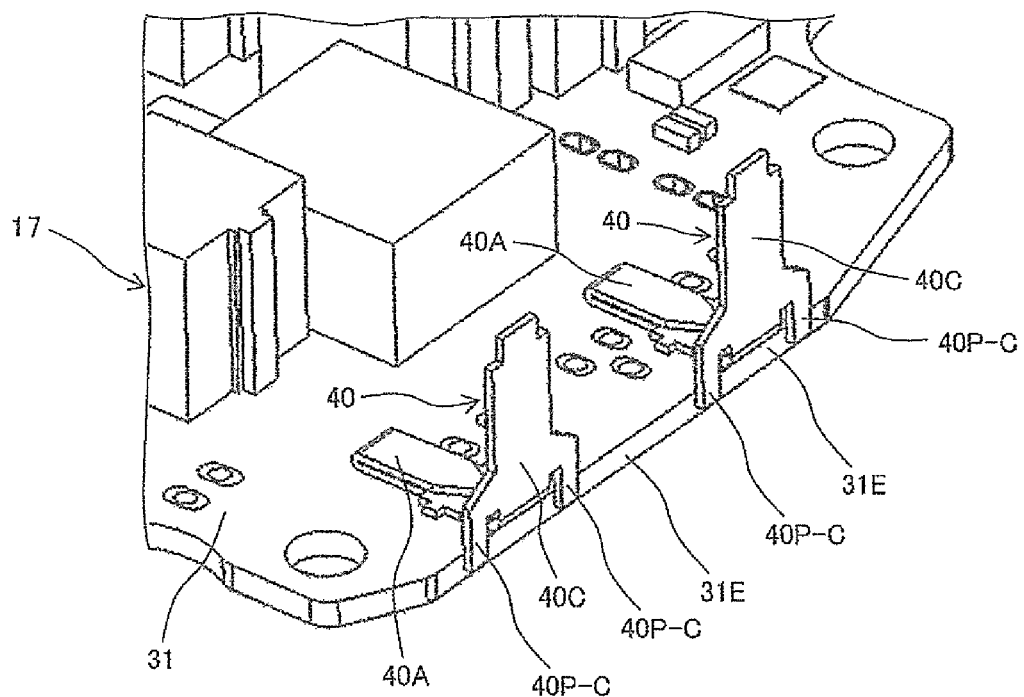
FIG. 10 is a perspective view of a principal part where power supply-side connector terminals are arranged on the power supply circuit unit, according to an embodiment of the present invention.

FIG. 10 depicts power supply-side connector terminals 40 of the power supply circuit unit 17, which are fixed to the glass epoxy circuit board 31, and their vicinities. A wiring pattern is formed on an upper surface of the glass epoxy circuit board 31 that is a board forming the power supply circuit unit 17, and electrical components and electronic components which form the power supply circuit are mounted on the wiring pattern. Further, two power supply-side connector terminals 40 that connect the power supply circuit unit 17 and connector assembly-side connector terminals (not shown) of the resin-made connector assembly 13 are mounted on the glass epoxy circuit board 31. The power supply-side connector terminal 40 is formed by bending a thin narrow flat metal plate, and has a substantially L-shape in cross section as shown in FIG. 11. Each bent surface of the power supply-side connector terminal 40 is a flat surface.

Figure 11:
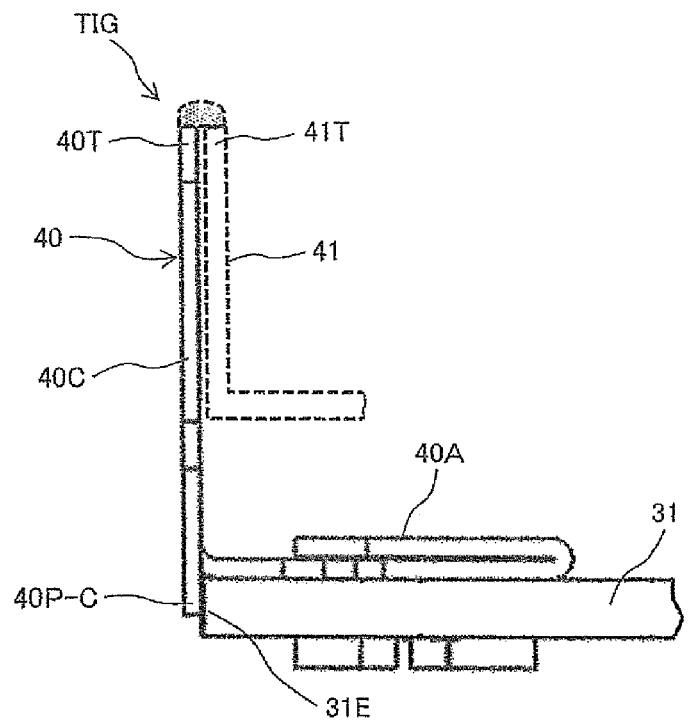
FIG. 11 is a cross section for explaining a first connecting state between the power supply-side connector terminal and a board.

As shown in FIGS. 10 and 11, the power supply-side connector terminal 40 is formed by a connector joining portion 40C that is located at an outward side with respect to an outer peripheral surface 31E of the glass epoxy circuit board 31 and joined to a connector assembly-side connector terminal 41 illustrated by a broken line (see FIG. 11) and a connector bonding portion 40A that extends from the connector joining portion 40C by being bent from the connector joining portion 40C and is connected to the wiring pattern formed on the glass epoxy circuit board 31. The connector bonding portion 40A is folded into two at some midpoint, and has a large (or heavy) mass so that the power supply-side connector terminal 40 does not collapse when put on the glass epoxy circuit board 31.

As shown in FIG. 10, the wiring pattern is formed on the surface of the glass epoxy circuit board 31, and the connector bonding portion 40A of the power supply-side connector terminal 40 is put on the wiring pattern and connected (bonded, fixed) to the wiring pattern (the glass epoxy circuit board 31) by soldering. That is, the connector bonding portion 40A is put on solder paste that is applied to the wiring pattern formed on the glass epoxy circuit board 31, and the power supply-side connector terminal 40 is connected (bonded, fixed) to the glass epoxy circuit board 31 by the reflow process. Here, since the connector bonding portion 40A has the flat surface shape, the connector bonding portion 40A serves as a suction surface when the power supply-side connector terminal 40 is put on the wiring pattern by an automatic mounting device.

As mentioned above, in the case where the power supply-side connector terminal 40 is bonded (fixed) to the glass epoxy circuit board 31 by the reflow process, since the solder existing at an inward side on the surface of the glass epoxy circuit board 31 is larger in quantity, in a state in which the solder melts by the reflow process, a phenomenon in which the power supply-side connector terminal 40 moves inwards on the glass epoxy circuit board 31 by surface tension etc. of the melted solder occurs.

Therefore, after the ref low process, in a process (see FIG. 11) in which the power supply-side connector terminal 40 and the connector assembly-side connector terminal 41 overlap each other and top ends 40T and 41T of the overlapping portions are joined together by TIG welding, if the power supply-side connector terminal 40 moves inwards on the glass epoxy circuit board 31, the power supply-side connector terminal 40 and the connector assembly-side connector terminal 41 interfere with each other, and as a consequence, a problem of not properly joining the top ends 40T and 41T together by TIG welding occurs. Further, as another problem, a bending external force acts on the power supply-side connector terminal 40 from the connector assembly-side connector terminal 41 in the TIG welding process, and a stress by which the power supply-side connector terminal 40 comes off the solder occurs.

In order to overcome such problems, in the present embodiment, as shown in FIGS. 10 and 11, movement stopper portions 40P-C that extend from the connector joining portion 40C to the glass epoxy circuit board 31 side are formed. Each of the movement stopper portions 40P-C is formed integrally with the connector joining portion 40C. In a state in which the connector bonding portion 40A of the power supply-side connector terminal 40 is put on the solder-applied surface of the glass epoxy circuit board 31, each movement stopper portion 40P-C contacts and engages with the outer peripheral surface 31E of the glass epoxy circuit board 31. This outer peripheral surface 31E of the glass epoxy circuit board 31 acts as a movement stopper part that stops the movement of the power supply-side connector terminal 40 with the movement stopper portion 40P-C contacting and engaging with the outer peripheral surface 31E.

Hence, by the contact and engagement between the outer peripheral surface 31E of the glass epoxy circuit board 31 and the movement stopper portion 40P-C, the phenomenon in which the power supply-side connector terminal 40 moves inwards on the glass epoxy circuit board 31 by the surface tension etc. of the melted solder, which occurs when the power supply-side connector terminal 40 is bonded (fixed) to the glass epoxy circuit board 31 by the ref low process and the solder existing at the inward side on the surface of the glass epoxy circuit board 31 is larger in quantity, can be prevented.

Accordingly, after the reflow process, as shown in FIG. 11, in the process in which the connector joining portion 40C of the power supply-side connector terminal 40 and the connector assembly-side connector terminal 41 overlap each other and the top ends 40T and 41T of the overlapping portions are joined together by TIG welding, the power supply-side connector terminal 40 does not move inwards on the glass epoxy circuit board 31, and is fixed to a correct position on the glass epoxy circuit board 31. Therefore, the power supply-side connector terminal 40 and the connector assembly-side connector terminal 41 do not interfere with each other, and the top ends 40T and 41T of the connector terminals can be properly joined together by TIG welding. Further, since the external force does not act on the power supply-side connector terminal 40 from the connector assembly-side connector terminal 41 in the TIG welding process, the problem of occurrence of the stress by which the power supply-side connector terminal 40 comes off the solder does not occur as well.

Next, a detailed shape of the power supply-side connector terminal 40 will be explained with reference to FIGS. 12 and 13. As mentioned above, the power supply-side connector terminal 40 is formed by bending a thin narrow flat metal plate, and has the substantially L-shape in cross section. Further, the power supply-side connector terminal 40 has the connector joining portion 400 joined to the connector assembly-side connector terminal 41 and the connector bonding portion 40A extending from the connector joining portion 400 by being bent from the connector joining portion 40C and connected to the wiring pattern formed on the glass epoxy circuit board 31.

At both sides in a width direction of the connector joining portion 400, inclined portions 40B are formed such that as the inclined portions 40B get closer to the connector bonding portion 40A, widths of the inclined portions 40B are increased. Then, when the widths of the inclined portions 40B each reach a predetermined width, the inclined portions 40B extend beyond a forming position of a bending part of the connector bonding portion 40A, and the movement stopper portions 40P-C are formed. Further, gaps 40S are formed at inward sides in the width direction of the movement stopper portions 40P-C. Between these gaps 40S, the connector bonding portion 40A is bent from the connector joining portion 400 into the substantially L-shape. With this shape, when putting the power supply-side connector terminal 40 on the glass epoxy circuit board 31 of the power supply circuit unit 17, as shown in FIG. 10, the power supply-side connector terminal 40 is put on the glass epoxy circuit board 31 such that the movement stopper portions 40P-C contact and engage with the outer peripheral surface 31E of the glass epoxy circuit board 31.

Here, since the power supply-side connector terminal 40 is formed by stamping a metal plate, by forming a hypotenuse (inclined side) of the inclined portion 40B, a removal working of burrs at this portion is omitted, then a manufacturing cost associated with removing the burrs can be reduced. Further, by forming the gaps 40S between each movement stopper portion 40P-C and the connector bonding portion 40A, workability of bending the connector bonding portion 40A is improved, then a manufacturing cost can be reduced.

Here, the movement stopper portion 40P-C shown in FIG. 11 extends downwards from the connector joining portion 400, i.e. extends toward the glass epoxy circuit board 31 side with the power supply-side connector terminal 40 being put on the glass epoxy circuit board 31. However, as the movement stopper, a structure shown in FIG. 14 can also be possible.

Figure 14:
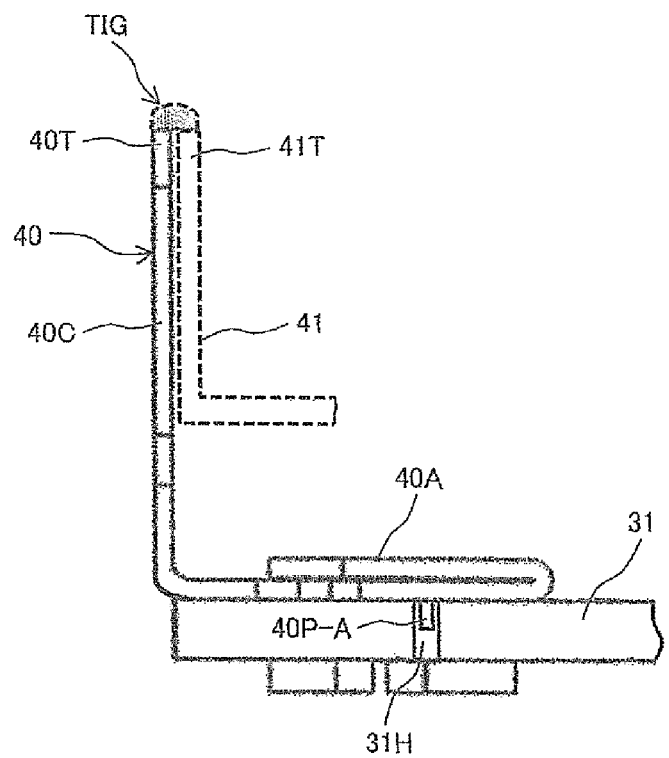
FIG. 14 is a cross section for explaining a second connecting state between the power supply-side connector terminal and the board.

In FIG. 14, a movement stopper part 31H formed from a penetration hole is formed at a part of the surface of the glass epoxy circuit board 31, and a movement stopper portion 40P-A inserted in and engaged with this movement stopper part 31H is formed at the connector bonding port ion 40A. In this case, when putting the power supply-side connector terminal 40 on the glass epoxy circuit board 31, by inserting and engaging the movement stopper portion 40P-A of the connector bonding portion 40A in and with the movement stopper part 31H, the phenomenon of the movement of the power supply-side connector terminal 40 in the ref low process can be prevented. It is noted that the movement stopper part 31H could be formed as a closed-bottomed hollow.

Figure 15:
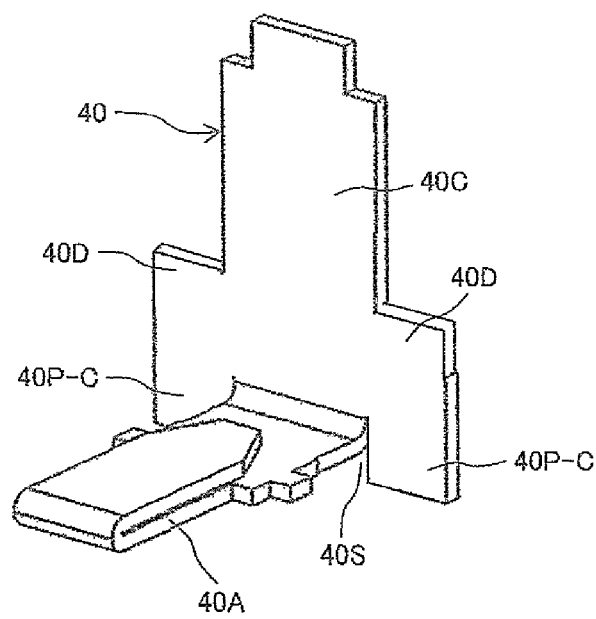
FIG. 15 is a perspective view for explaining a second shape of the power supply-side connector terminal.

Next, a second shape of the power supply-side connector terminal 40 will be explained. In FIG. 15, at both sides in the width direction of the connector joining portion 40C, wide portions 40D are formed such that as the wide portions 40D get closer to the connector bonding portion 40A, widths of the wide portions 40D are increased in a direction orthogonal to the connector joining portion 40C. Then, the wide portions 40D extend beyond the forming position of the bending part of the connector bonding portion 40A, and movement stopper portions 40P-C are formed.

Figure 12:
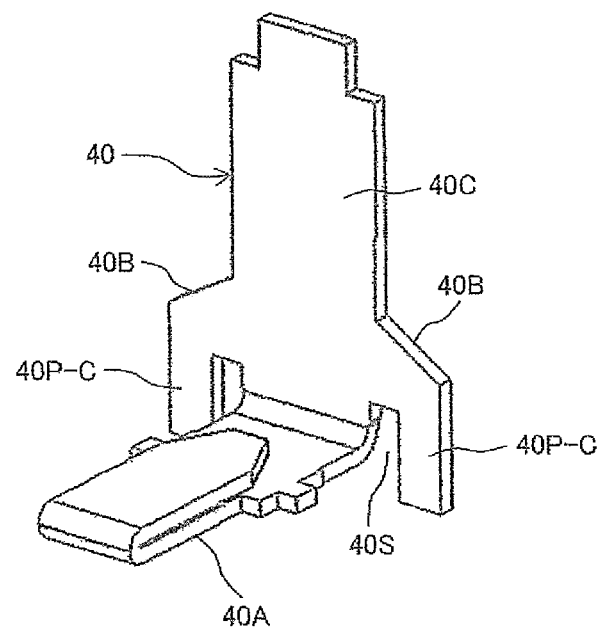
FIG. 12 is a perspective view for explaining a first shape of the power supply-side connector terminal.
Figure 13:
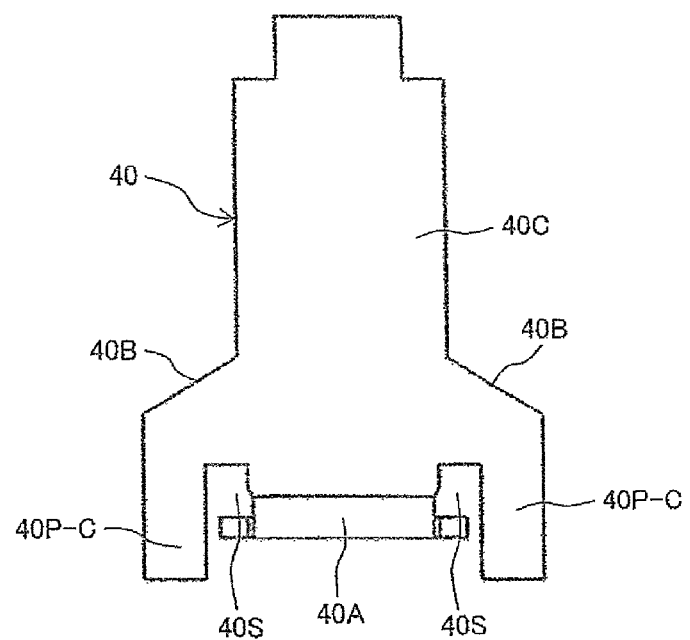
FIG. 13 is a front view of the power supply-side connector terminal shown in FIG. 12.

Further, in the same manner as the power supply-side connector terminal 40 shown in FIG. 12, gaps 40S are formed at inward sides in the width direction of the movement stopper portions 40P-C. Between these gaps 40S, the connector bonding portion 40A is bent from the connector joining portion 40C into the substantially L-shape. With this shape, when putting the power supply-side connector terminal 40 on the glass epoxy circuit board 31 of the power supply circuit unit 17, in the same manner as the power supply-side connector terminal 40 shown in FIG. 10, the power supply-side connector terminal 40 is put on the glass epoxy circuit board 31 such that the movement stopper portions 40P-C contact and engage with the outer peripheral surface 31E of the glass epoxy circuit board 31.

Figure 16:
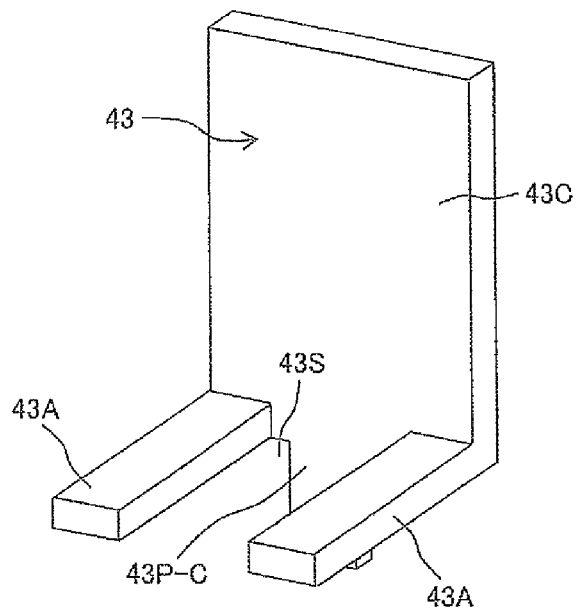
FIG. 16 is a perspective view for explaining a third shape of the power supply-side connector terminal.
Figure 17:
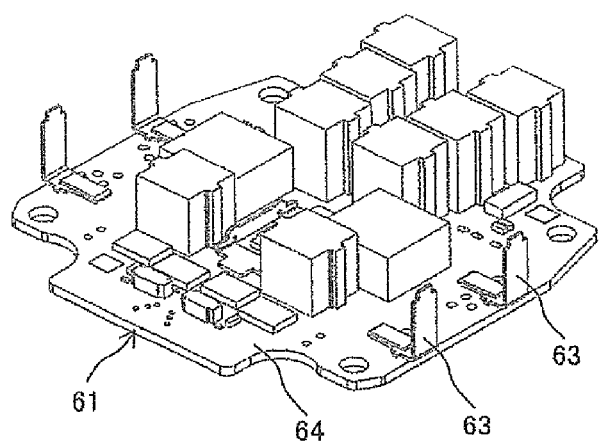
FIG. 17 is a perspective view of a part where power supply-side connector terminals are arranged on a power supply circuit unit, according to a related art.

Next, a third shape of the power supply-side connector terminal will be explained. In FIG. 16, a power supply-side connector terminal 43 is formed by bending a thin narrow flat metal plate, and has a substantially L-shape in cross section. The power supply-side connector terminal 43 has a connector joining portion 43C joined to the connector assembly-side connector terminal 41 and connector bonding portions 43A extending from the connector joining portion 43C by being bent from the connector joining portion 43C and connected to the wiring pattern formed on the glass epoxy circuit board 31.

At both sides in the width direction of the connector joining portion 43C, the connector bonding portions 43A are formed by being bent. Further, gaps 43S are formed at inward sides in the width direction of the connector bonding portions 43A. Between these gaps 439, a movement stopper portion 43P-C extends downwards from the connector joining portion 43C, i.e. extends toward the glass epoxy circuit board 31 side with the power supply-side connector terminal 43 being put on the glass epoxy circuit board 31. With this shape, when putting the power supply-side connector terminal 43 on the glass epoxy circuit board 31 of the power supply circuit unit 17, in the same manner as the power supply-side connector terminal 40 shown in FIG. 10, the power supply-side connector terminal 43 is put on the glass epoxy circuit board 31 such that the movement stopper portion 43P-C contacts and engages with the outer peripheral surface 31E of the glass epoxy circuit board 31.

As explained above, in present invention, a connector terminal is formed by a connector joining portion that is joined to a mating connector terminal, a connector bonding portion that is bent from the connector joining portion and extends along a surface of a board and a movement stopper portion that engages with a movement stopper part provided at the board and stops the connector bonding portion from moving on the surface of the board. In a state in which the connector bonding portion is put on solder applied to the board, the movement stopper portion engages with the movement stopper part of the board, and the connector terminal is bonded and fixed to the board with melted solder.

According to the present invention, when soldering the connector terminal to the board by the ref low process, the movement stopper portion engages with the movement stopper part of the board. Therefore, in a state in which the solder melts by the reflow process, the connector terminal does not move on the board by surface tension etc. of the melted solder, and the connector terminal can be soldered to a correct position on the board.

The present invention is not limited to the above embodiment, and includes all design modifications. The above embodiment is an embodiment that is explained in detail to easily understand the present invention, and the present invention is not necessarily limited to the embodiment having all elements or components described above. Further, a part of the configuration of the embodiment can be replaced with a configuration of other embodiments. Also, the configuration of other embodiments could be added to the configuration of the embodiment. Moreover, regarding a part of the configuration of the embodiment, the configuration of other embodiments could be added, removed and replaced.

As an electric drive device based on the above embodiment and modified example, for instance, the followings are raised.

That is, as one aspect of the present invention, an electric drive device comprises: an electric motor driving a mechanical control element; a motor housing accommodating therein the electric motor; and an electronic control unit provided at an end surface portion side of the motor housing which is an opposite side to an output shaft portion of a rotation shaft of the electric motor and configured to drive the electric motor, wherein a connector terminal provided at the electronic control unit has; a connector joining portion joined to a mating connector terminal; a connector bonding portion bent from the connector joining portion and extending along a surface of a board that forms the electronic control unit; and a movement stopper portion engaging with a movement stopper part provided at the board and structured to stop the connector bonding portion from moving on the surface of the board, and in a state in which the connector bonding portion is put on solder applied to the board, the movement stopper portion engages with the movement stopper part of the board, and the connector terminal is bonded and fixed to the board with melted solder.

As a preferable electric drive device, in the above electric drive device, the electronic control unit is dividable into a connector assembly connected to an external power supply, a power supply circuit unit having a main function of generating power, a power conversion circuit unit having a main function of driving the electric motor and a control circuit unit having a main function of controlling the power conversion circuit unit, a power supply-side connector terminal as the connector terminal which connects the connector assembly and the power supply circuit unit has; the connector joining portion joined to the connector terminal of the connector assembly; the connector bonding portion bent from the connector joining portion and extending along a surface of a power supply circuit board that forms the power supply circuit unit; and the movement stopper portion engaging with the movement stopper part provided at the power supply circuit board and structured to stop the connector bonding portion from moving on the surface of the power supply circuit board, in a state in which the connector bonding portion is put on solder applied to the power supply circuit board, the movement stopper portion engages with the movement stopper part of the power supply circuit board, and the connector terminal is bonded and fixed to the power supply circuit board with melted solder, and a top end side of the connector terminal of the connector assembly and a top end side of the connector joining portion of the power supply-side connector terminal are joined together by TIG welding.

As a far preferable electric drive device, in the above electric drive device, the power supply-side connector terminal has a substantially L-shape in cross section by the connector joining portion and the connector bonding portion bent from the connector joining portion.

As a far preferable electric drive device, in the above electric drive device, the movement stopper portion is formed by the connector joining portion extending beyond the connector bonding portion bent from the connector joining portion, and in a state in which the connector bonding portion of the power supply-side connector terminal is put on a solder-applied surface of the power supply circuit board, the movement stopper portion engages with an outer peripheral surface, as the movement stopper part, of the power supply circuit board.

As a far preferable electric drive device, in the above electric drive device, the power supply-side connector terminal has, at both sides in a width direction of the connector joining portion, inclined portions whose widths are increased toward the connector bonding portion, and the movement stopper portions are formed by the inclined portions each having a predetermined width and extending beyond a forming position of the connector bonding portion, and gaps are formed at inward sides in the width direction of the movement stopper portions, and the connector bonding portion is bent from the connector joining portion into the substantially L-shape between the gaps.

As a far preferable electric drive device, in the above electric drive device, the movement stopper portion is formed at the connector bonding portion bent from the connector joining portion, and in a state in which the connector bonding portion of the power supply-side connector terminal is put on a solder-applied surface of the power supply circuit board, the movement stopper portion engages with the movement stopper part provided on the surface of the power supply circuit board.

As an electric power steering device based on the above embodiment and modified example, for instance, the followings are raised.

That is, as one aspect of the present invention, an electric power steering device comprises: an electric motor providing a steering assistive force to a steering shaft on the basis of an output from a torque sensor that detects a turning direction and a turning torque of the steering shaft; a motor housing accommodating therein the electric motor; an electronic control unit provided at an end surface portion side of the motor housing which is an opposite side to an output shaft portion of a rotation shaft of the electric motor and configured to drive the electric motor; and a cover covering the electronic control unit, wherein a connector terminal provided at the electronic control unit has; a connector joining portion joined to a mating connector terminal; a connector bonding portion bent from the connector joining portion and extending along a surface of a board that forms the electronic control unit; and a movement stopper portion engaging with a movement stopper part provided at the board and structured to stop the connector bonding portion from moving on the surface of the board, and in a state in which the connector bonding portion is put on solder applied to the board, the movement stopper portion engages with the movement stopper part of the board, and the connector terminal is bonded and fixed to the board with melted solder.

As a preferable electric power steering device, in the above electric power steering device, the electronic control unit is dividable into a connector assembly connected to an external power supply, a power supply circuit unit having a main function of generating power, a power conversion circuit unit having a main function of driving the electric motor and a control circuit unit having a main function of controlling the power conversion circuit unit, a power supply-side connector terminal as the connector terminal which connects the connector assembly and the power supply circuit unit has; the connector joining portion joined to the connector terminal of the connector assembly; the connector bonding portion bent from the connector joining portion and extending along a surface of a power supply circuit board that forms the power supply circuit unit; and the movement stopper portion engaging with the movement stopper part provided at the power supply circuit board and structured to stop the connector bonding portion from moving on the surface of the power supply circuit board, in a state in which the connector bonding portion is put on solder applied to the power supply circuit board, the movement stopper portion engages with the movement stopper part of the power supply circuit board, and the connector terminal is bonded and fixed to the power supply circuit board with melted solder, and a top end side of the connector terminal of the connector assembly and a top end side of the connector joining portion of the power supply-side connector terminal are joined together by TIG welding.

As a far preferable electric power steering device, in the above electric power steering device, the power supply-side connector terminal has a substantially L-shape in cross section by the connector joining portion and the connector bonding portion bent from the connector joining portion.

As a far preferable electric power steering device, in the above electric power steering device, the movement stopper portion is formed by the connector joining port on extending beyond the connector bonding portion bent from the connector joining portion, and in a state in which the connector bonding portion of the power supply-side connector terminal is put on a solder-applied surface of the power supply circuit board, the movement stopper portion engages with an outer peripheral surface, as the movement stopper part, of the power supply circuit board.

As a far preferable electric power steering device, in the above electric power steering device, the power supply-side connector terminal has, at both sides in a width direction of the connector joining portion, inclined portions whose widths are increased toward the connector bonding portion, and the movement stopper portions are formed by the inclined portions each having a predetermined width and extending beyond a forming position of the connector bonding portion, and gaps are formed at inward sides in the width direction of the movement stopper portions, and the connector bonding portion is bent from the connector joining portion into the substantially L-shape between the gaps.

As a far preferable electric power steering device, in the above electric power steering device, the movement stopper portion is formed at the connector bonding portion bent from the connector joining portion, and in a state in which the connector bonding portion of the power supply-side connector terminal is put on a solder-applied surface of the power supply circuit board, the movement stopper portion engages with the movement stopper part provided on the surface of the power supply circuit board.

The invention claimed is:

1. An electric drive device comprising:
an electric motor driving a mechanical control element;
a motor housing accommodating therein the electric motor; and
an electronic control unit provided at an end surface portion side of the motor housing which is an opposite side to an output shaft portion of a rotation shaft of the electric motor and configured to drive the electric motor, wherein
a connector terminal provided at the electronic control unit has;
a connector joining portion joined to a mating connector terminal;
a connector bonding portion bent from the connector joining portion and extending along a surface of a board that forms the electronic control unit; and
a movement stopper portion engaging with an outer peripheral surface of the board and structured to stop the connector bonding portion from moving on the surface of the board, and
in a state in which the connector bonding portion is put on solder applied to the board, the movement stopper portion engages with the outer peripheral surface of the board, and the connector terminal is bonded and fixed to the board with melted solder.

2. The electric drive device as claimed in claim 1, wherein:
the electronic control unit is dividable into a connector assembly connected to an external power supply, a power supply circuit unit having a main function of generating power, a power conversion circuit unit having a main function of driving the electric motor and a control circuit unit having a main function of controlling the power conversion circuit unit,
a power supply-side connector terminal as the connector terminal which connects the connector assembly and the power supply circuit unit has;
the connector joining portion joined to the connector terminal of the connector assembly;
the connector bonding portion bent from the connector joining portion and extending along a surface of a power supply circuit board that forms the power supply circuit unit; and
the movement stopper portion engaging with the outer peripheral surface of the power supply circuit board and structured to stop the connector bonding portion from moving on the surface of the power supply circuit board,
in a state in which the connector bonding portion is put on solder applied to the power supply circuit board, the movement stopper portion engages with the outer peripheral surface of the power supply circuit board, and the connector terminal is bonded and fixed to the power supply circuit board with melted solder, and
a top end side of the connector terminal of the connector assembly and a top end side of the connector joining portion of the power supply-side connector terminal are joined together by TIG welding.

3. The electric drive device as claimed in claim 2, wherein:
the power supply-side connector terminal has a substantially L-shape in cross section by the connector joining portion and the connector bonding portion bent from the connector joining portion.

4. The electric drive device as claimed in claim 3, wherein:
the movement stopper portion is formed by the connector joining portion extending beyond the connector bonding portion bent from the connector joining portion, and
in a state in which the connector bonding portion of the power supply-side connector terminal is put on a solder-applied surface of the power supply circuit board, the movement stopper portion engages with the outer peripheral surface of the power supply circuit board.

5. The electric drive device as claimed in claim 4, wherein:
the power supply-side connector terminal has, at both sides in a width direction of the connector joining portion, inclined portions whose widths are increased toward the connector bonding portion, and the movement stopper portions are formed by the inclined portions each having a predetermined width and extending beyond a forming position of the connector bonding portion, and
gaps are formed at inward sides in the width direction of the movement stopper portions, and the connector bonding portion is bent from the connector joining portion into the substantially L-shape between the gaps.

6. An electric drive device comprising:
an electric motor driving a mechanical control element;
a motor housing accommodating therein the electric motor; and
an electronic control unit provided at an end surface portion side of the motor housing which is an opposite side to an output shaft portion of a rotation shaft of the electric motor and configured to drive the electric motor, wherein
a connector terminal provided at the electronic control unit has;
a connector joining portion joined to a mating connector terminal;
a connector bonding portion bent from the connector joining portion and extending along a surface of a board that forms the electronic control unit; and
a movement stopper portion structured to stop the connector bonding portion from moving on the surface of the board, wherein a movement stopper part is formed so as to penetrate the board at a position where the connector bonding portion is placed, and the movement stopper portion is inserted into the movement stopper part without sticking out of the board, and
the movement stopper portion is formed at the connector bonding portion bent from the connector joining portion, and
in a state in which the connector bonding portion of the connector terminal is put on a solder-applied surface of the board, the movement stopper portion engages with the movement stopper part provided on the surface of the board.

7. An electric power steering device comprising:
an electric motor providing a steering assistive force to a steering shaft on the basis of an output from a torque sensor that detects a turning direction and a turning torque of the steering shaft;
a motor housing accommodating therein the electric motor;
an electronic control unit provided at an end surface portion side of the motor housing which is an opposite side to an output shaft portion of a rotation shaft of the electric motor and configured to drive the electric motor; and a cover covering the electronic control unit, wherein
a connector terminal provided at the electronic control unit has;
   a connector joining portion joined to a mating connector terminal;
   a connector bonding portion bent from the connector joining portion and extending along a surface of a board that forms the electronic control unit; and
   a movement stopper portion engaging with an outer peripheral surface of the board and structured to stop the connector bonding portion from moving on the surface of the board, and
in a state in which the connector bonding portion is put on solder applied to the board, the movement stopper portion engages with the outer peripheral surface of the board, and the connector terminal is bonded and fixed to the board with melted solder.

8. The electric power steering device as claimed in claim 7, wherein:
the electronic control unit is dividable into a connector assembly connected to an external power supply, a power supply circuit unit having a main function of generating power, a power conversion circuit unit having a main function of driving the electric motor and a control circuit unit having a main function of controlling the power conversion circuit unit,
a power supply-side connector terminal as the connector terminal which connects the connector assembly and the power supply circuit unit has;
   the connector joining portion joined to the connector terminal of the connector assembly;
   the connector bonding portion bent from the connector joining portion and extending along a surface of a power supply circuit board that forms the power supply circuit unit; and
   the movement stopper portion engaging with the outer peripheral surface of the power supply circuit board and structured to stop the connector bonding portion from moving on the surface of the power supply circuit board,
in a state in which the connector bonding portion is put on solder applied to the power supply circuit board, the movement stopper portion engages with the outer peripheral surface of the power supply circuit board, and the connector terminal is bonded and fixed to the power supply circuit board with melted solder, and
a top end side of the connector terminal of the connector assembly and a top end side of the connector joining portion of the power supply-side connector terminal are joined together by TIG welding.

9. The electric power steering device as claimed in claim 8, wherein:
the power supply-side connector terminal has a substantially L-shape in cross section by the connector joining portion and the connector bonding portion bent from the connector joining portion.

10. The electric power steering device as claimed in claim 9, wherein:
the movement stopper portion is formed by the connector joining portion extending beyond the connector bonding portion bent from the connector joining portion, and
in a state in which the connector bonding portion of the power supply-side connector terminal is put on a solder-applied surface of the power supply circuit board, the movement stopper portion engages with the outer peripheral surface of the power supply circuit board.

11. The electric power steering device as claimed in claim 10, wherein:
the power supply-side connector terminal has, at both sides in a width direction of the connector joining portion, inclined portions whose widths are increased toward the connector bonding portion, and the movement stopper portions are formed by the inclined portions each having a predetermined width and extending beyond a forming position of the connector bonding portion, and
gaps are formed at inward sides in the width direction of the movement stopper portions, and the connector bonding portion is bent from the connector joining portion into the substantially L-shape between the gaps.

12. An electric power steering device comprising:
an electric motor providing a steering assistive force to a steering shaft on the basis of an output from a torque sensor that detects a turning direction and a turning torque of the steering shaft;
a motor housing accommodating therein the electric motor;
an electronic control unit provided at an end surface portion side of the motor housing which is an opposite side to an output shaft portion of a rotation shaft of the electric motor and configured to drive the electric motor; and
a cover covering the electronic control unit, wherein
a connector terminal provided at the electronic control unit has;
   a connector joining portion joined to a mating connector terminal;
   a connector bonding portion bent from the connector joining portion and extending along a surface of a board that forms the electronic control unit; and
   a movement stopper portion structured to stop the connector bonding portion from moving on the surface of the board, wherein a movement stopper part is formed so as to penetrate the board at a position where the connector bonding portion is placed, and the movement stopper portion is inserted into the movement stopper part without sticking out of the board, and
the movement stopper portion is formed at the connector bonding portion bent from the connector joining portion, and
in a state in which the connector bonding portion of the connector terminal is put on a solder-applied surface of the board, the movement stopper portion engages with the movement stopper part provided on the surface of the board.

* * * * *